United States Patent [19]
Jolliffe et al.

[11] Patent Number: 5,646,862
[45] Date of Patent: Jul. 8, 1997

[54] VENDOR-NEUTRAL INTEGRATED VEHICLE ELECTRICAL DESIGN AND ANALYSIS SYSTEM AND METHOD

[75] Inventors: Jennifer Anne Jones Jolliffe, Franklin; Manu Vedapudi, Canton; Shaun Stephen Devlin, Bloomfield Hills; Robert Jay Louch, Walled Lake, all of Mich.

[73] Assignee: Ford Motor Company, Dearborn, Mich.

[21] Appl. No.: 315,163

[22] Filed: Sep. 29, 1994

[51] Int. Cl.$^6$ ................................................. B60R 16/00
[52] U.S. Cl. ................................................... 364/488
[58] Field of Search ................................. 364/488, 489, 364/490, 491, 578, 200, 401, 518; 395/500

[56] References Cited

U.S. PATENT DOCUMENTS

| | | | |
|---|---|---|---|
| 4,714,995 | 12/1987 | Materna et al. | 364/200 |
| 4,875,162 | 10/1989 | Ferriter et al. | 364/401 |
| 4,922,432 | 5/1990 | Kobayashi et al. | 364/490 |
| 5,050,091 | 9/1991 | Rubin | 364/488 |
| 5,197,016 | 3/1993 | Sugimoto et al. | 364/490 |
| 5,208,765 | 5/1993 | Turnbull | 364/552 |
| 5,475,833 | 12/1995 | Dauerer et al. | 395/600 |
| 5,479,355 | 12/1995 | Hyduke | 364/488 |
| 5,485,615 | 1/1996 | Wennmyr | 395/700 |

Primary Examiner—Kevin J. Teska
Assistant Examiner—Stephen J. Walder, Jr.
Attorney, Agent, or Firm—Joseph W. Malleck; Roger L. May

[57] ABSTRACT

An integrated Vehicle Electrical Design and analysis System (VEDS) which is adapted to accommodate data interchanged between multiple vendor-independent Computer Aided Engineering (CAE) tools. The system includes a Vehicle Database (VDB) which is operative as a central repository to store all design, analysis and library information. The VDB is interfaced and data is exchanged with the CAE tools through an interface which is predominantly object-oriented using Common Lisp Object System (CLOS). For each tool, an outbound translator is operative to translate the tool's internal data structures into a standard interchange format. Similarly, for each tool, an inbound translator is operative to translate a standard or tool specific interchange format into the tool's internal data structures. The VDB also includes an inbound and an outbound translator. The inbound translator is operative to load data structures from each of the CAE tools into the VDB. The outbound translator is operative to extract selected design data from the VDB and translate it into the standard interchange format or a tool specific interchange format. A Design Manager and an Integration Mechanism are also provided to assist the user in accessing the VDB, launching selected CAE tools, initiating VDB translations, and invoking and controlling data flow to and from selected CAE tools.

4 Claims, 9 Drawing Sheets

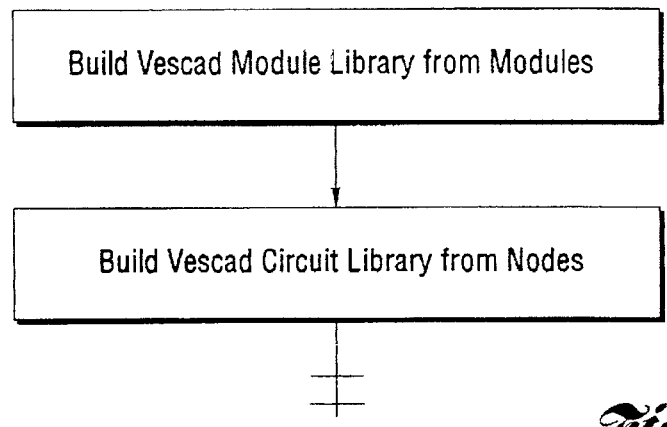
Fig. 13
Fig. 14
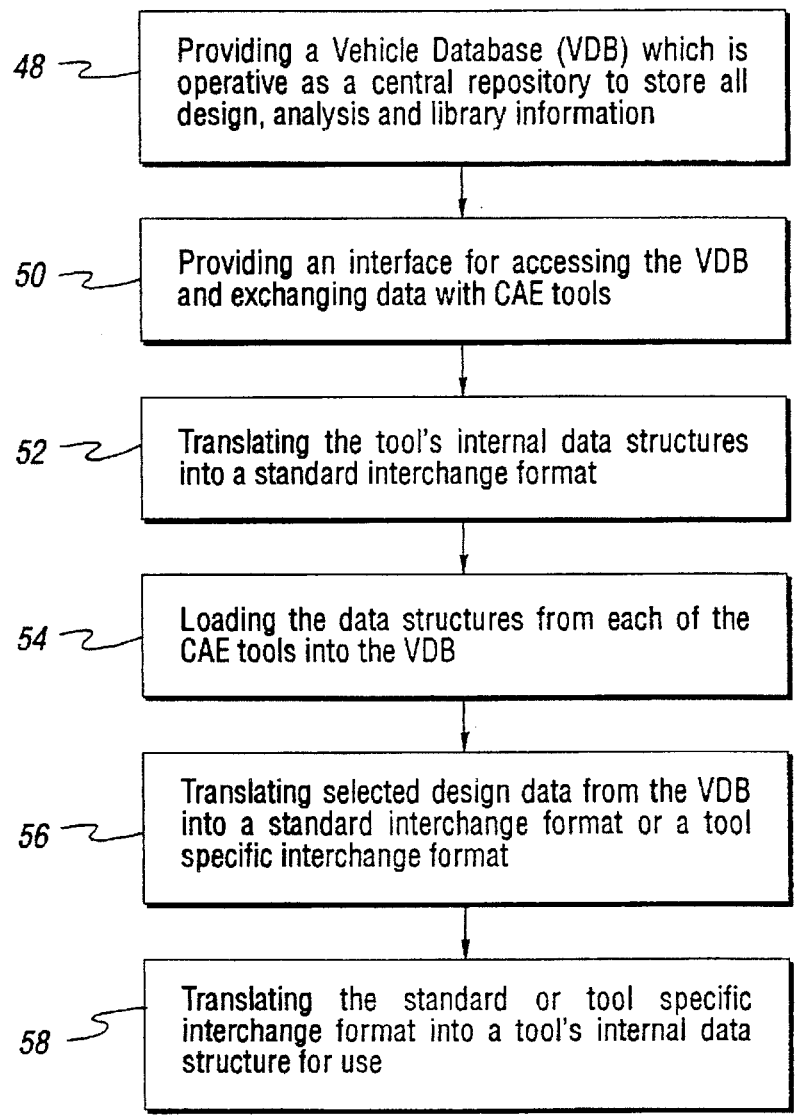

VENDOR-NEUTRAL INTEGRATED VEHICLE ELECTRICAL DESIGN AND ANALYSIS SYSTEM AND METHOD

TECHNICAL FIELD

This invention relates generally to vehicle electrical/electronic design systems. More particularly, the present invention relates to an integration strategy for a Vendor Independent Electrical Computer Aided Engineering (CAE) Environment.

BACKGROUND ART

System designers must currently re-enter data in order to use different Computer Aided Engineering (CAE) tools. For instance, the "net list" as the term is used by those skilled in the art, once obtained from a schematic must be re-entered during module definition in a 2-D layout process. This process is manual, slow and highly prone to error.

With current technology, any changes made in advanced portions of a design process must also be manually reflected in earlier designed tools. For instance, connectivity changes made in a layout tool must be re-drawn in a schematic tool. This again is a manual process, but also a non-value added process which often leads to inconsistent versions of data. As a result, it is difficult to achieve any significant benefits in design by modeling since at every stage data must be re-entered into new design tools as a design passes through its various stages.

As those skilled in the art will recognize, computer aided engineering tool technology is in a state of rapid change. It is thus unrealistic to expect a single vendor, let alone an Original Equipment Manufacturer (OEM), to provide a single solution to the complex vehicle specific engineering process. To truly engineer a vehicle, unexpected combinations of data must be available for analysis without resorting to reproducing data already designed. If properly analyzed, fewer prototypes would be needed to find all unexpected interactions.

There have been previous attempts to integrate into one system a variety of computer aided product design tools. None of these systems, however, addresses the problems identified and solved by the present invention.

For example, U.S. Pat. No. 4,922,432 to Kobayshi et al. discloses a CAD system for designing Application Specific Integrated Circuits (ASICs). The system allows engineers to use a simulator to develop flow charts defining a functional specification for an ASIC. The designated specification is then entered into a knowledge-based silicon compiler which generates from the flow chart a net list which can be input into any existing VLSI CAD tool for generating a chip topological information required to produce the ASIC. The system includes a knowledge base for storing ASIC design data and a database (cell library) for storing previously-designed, tested and proven hardware cells. The system may be implemented on a computer such as a Sun or a VAX running a view NIX operating system.

U.S. Pat. No. 4,875,162 to Ferriter et al. similarly discloses a method for interfacing a project management tool with a conceptual design tool used for building and modifying the structure of a product such as a lawnmower. In operation, the project management tool interface prompts a user to define various items concerning the product structure. This design data is put into a database and a hierarchical tree of the structure is generated on a computer screen. The user may then access this information from manufacturing data gathered by the conceptual design tool. The data accessed is formatted in a file of the project management tool and then imported into the project management tool. This data can then be modified by the project management tool and can be reformatted for export to the conceptual design tool so as to allow the design process to continue with updated project data.

Consequently, a need has developed for an integration strategy which will support vendor and tool independence. More specifically, a need has developed for an integrated vehicle electrical design and analysis system and method which are adapted to accommodate data interchange between multiple vendor-independent Computer Aided Engineering tools. Such a method and system should be operable in a dynamic and responsive environment. Moreover, such a method and system should have the ability to postpone and determine when and what translations of data are needed so as to ensure that the designer has the most current version of the data in the correct format with the minimal amount of processing.

DISCLOSURE OF THE INVENTION

It is a general object of the present invention to provide a mechanism to build information bridges between design and analysis tools and between different design tools.

More specifically, it is an object of the present invention to provide a vendor-neutral integrated vehicle electrical design and analysis system and method for use with a plurality of Computer Aided Engineering (CAE) tools.

Still further, it is an object of the present invention to provide a system and method for data exchange and communication between vendor independent tools and tools that do not necessarily speak the same language or have the same concepts.

Yet still further, it is an object of the present invention to provide a neutral data structure format which may be implemented by a centralized database so as to permit mass communication between and among different design and analysis tools.

In carrying out the above stated objects and other objects, features and advantages of the present invention, there is provided an integrated Vehicle Electrical Design and analysis System (VEDS) which is adapted to accommodate data interchange between multiple vendor-independent Computer Aided Engineering (CAE) tools. The system comprises a Vehicle Database (VDB) which is operative as a central repository to store all design, analysis and library information. An interface is further provided for accessing the VDB and exchanging data with the CAE tools. In a preferred embodiment, the interface is written in LISP and is predominantly object-oriented using Common Lisp Object System (CLOS).

For each tool, an outbound translator is provided which is operative to translate the tool's internal data structures into a standard interchange format. Similarly, for each tool, an inbound translator is provided which is operative to translate the standard or tool specific interchange format into the tool's internal data structures. The VDB also includes an inbound and an outbound translator. The inbound translator is operative to load data structures from each of the CAE tools into the VDB. Similarly, the outbound VDB translator is operative to extract selected design data from the VDB and translate it into the standard interchange format or a tool specific interchange format.

In keeping with the invention, there is further provided a Design Manager, typically a Graphical User Interface (GUI)

which is operative to assist a user in accessing the VDB, launching selected CAE tools and initiating VDB translations. An Integration Mechanism is also provided which is operative to invoke and control data flow to and from selected CAE tools. In a preferred embodiment, the integration mechanism comprises UNIX scripts.

In further keeping with the present invention, there is provided a method for accommodating data interchange between multiple vendor-independent Computer Aided Engineering (CAE) tools. The method is directed specifically for use in an integrated Vehicle Electrical Design and analysis System (VEDS). The method comprises the initial provision of a Vehicle Database (VDB) which is operative as a central repository to store all design, analysis and library information. The method further includes providing an interface for accessing the VDB and exchanging data with the CAE tools. As in the system above, in a preferred embodiment, the interface is preferably written in Lisp and is predominantly object-oriented using Common Lisp Object System (CLOS).

At each tool, internal data structures are translated into a standard interchange format. The data structures in the interchange format are thereafter loaded from each of the CAE tools into the VDB. Once information is stored within the VDB, selected design data may be extracted and translated into the referenced standard interchange format or a tool-specific interchange format. At each of the tools, the interchange format may thereafter be translated into the tool's own internal data structure.

As in the system above, a design manager, preferably a Graphical User Interface (GUI) is also provided for assisting the user in accessing VDB, launching selected CAE tools and initiating VDB translations. An integration mechanism is also provided which is operative to invoke and control data flow to and from selected CAE tools.

The above objects and other objects, features, and advantages of the present invention are readily apparent from the following detailed description of the best modes for carrying out the invention when taken in connection with the accompanying drawings wherein like reference numerals correspond to like components.

BRIEF DESCRIPTION OF THE DRAWINGS

FIG. 13 is a flow diagram illustrating the manipulation to be consistent with the VESCAD target tools in accordance with the present invention; and FIG. 14 is a block diagram of the method steps of the present invention.

BEST MODES FOR CARRYING OUT THE INVENTION

Figure 1:
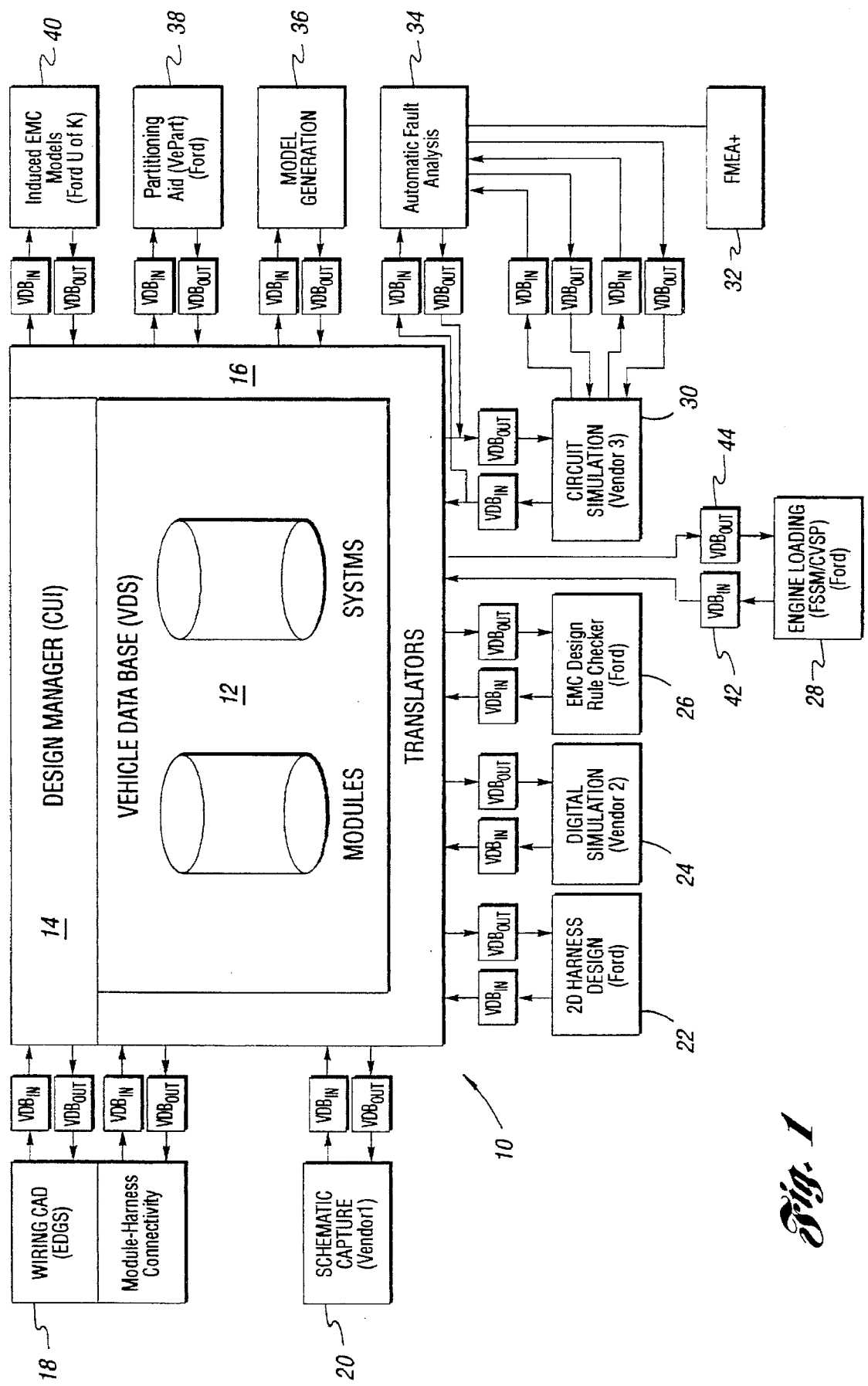
FIG. 1 is a generalized block diagram of the system of the present invention.

FIG. 1 of the drawings illustrates a generalized block diagram of the integrated Vehicle Electrical Design analysis System (VEDS) of the present invention. The system is designated generally by reference numeral 10. System 10 includes a Vehicle Database (VDB) 12, a design manager 14 which is typically a Graphical User Interface (GUI) and a plurality of Computer Aided Engineering (CAE) design tools which are shown interfacing with vehicle database 12 via translator 16. The CAE tools include, by way of example, wiring CAD 18, schematic capture 20, 2D harness design 22, digital simulation 24, EMC design rule checker 26, engine loading 28, circuit simulation 30, FMEA+ 32, automatic fault analysis 34, model generation 36, partitioning aide 38, and induced EMC model 40.

Each of the CAE design tools are shown in communication with Vehicle Database (VDB) 12 via translator 16 and, more particularly, a VDB inbound translator 42 and a VDB outbound translator 44, as shown in FIG. 1.

In operation, vehicle database 12 acts as a central hub of information flow. Common data in the design is stored once, and updated as needed by the different CAE tools 18–40. Tool specific information, such as native names and formats, are also supported by relating that specific information to the common data in the VDB 12.

To support vendor independence, the data model of FIG. 1 is built from industry standards where available. Where standards are not available for the vehicle design, the model must accurately support the data by providing a superset of all data required, and provide for that non-standard data's mapping to standard formats.

The translators, as shown in FIG. 1, distinguish in the tool native files that information which populates the common data in the model and that which is specific to the tool. The common data is accessible by any tool in the integrated suite. The specific data is used when recreating the tool data file.

Currently, the data model is supported by a relational database accessed using CLOS, an object-oriented extension to common LISP. The technology is not specific to the relational paradigm and is contemplated by applicants to be usable with a purely object-oriented database. Tools may be accessed in a distributed fashion, running on any server accessible on the network. The user is unaware how the tool is invoked. The administrative task of distributing tools throughout the networks is localized to one system.

In operation, the user is also insulated from the translators and the database access. The user simply picks which dataset to use and selects the appropriate tool to invoke through the design manager interface 14. The system carries out the correct data manipulations and process implications. This relieves the user from the confusion of constantly switching between various design/analysis tools. The design process is hierarchical in nature, and a data model must support this for several data elements in the design.

As known to those skilled in the art, and with reference still to FIG. 1 of the drawings, CAE tools 18, 20 and 22 are examples of design tools where the user describes the design in an appropriate level of detail for the part of the process the user is in. Typically, the user describes the most simplified abstract. Thus, the user might first work with tool 20, then elaborate it with tool 22. Thereafter, the user may further elaborate the design with tool 18. There might also be additional tools (not shown) which perform full 3-D harness design.

All of the CAE tools 18–40 are places where the user will analyze her design against some set of criteria or some aspect of the tool's performance. For example, one simulator may allow the user to simulate/calculate the expected continuous behavior of voltages and currents in a circuit assuming only conducted relations. EMC tool 40 adds to that the capability of allowing induced voltages between circuits that are not in contact. FMEA tool 32 allows the user to explore the behavior of a circuit where some of the elements are broken or are not there. Still further, engine loading tool 28 allows the user to study the relationship between the electrical system and the mechanical system. For example, there is a relationship if electricity is being generated by an alternator that is being driven by an engine.

Each of the CAE tools 18–40 are shown in communication with vehicle database 12 which, as indicated above, is where the information is stored. Translators 16 are wrapped around VDB 12 to translate from the superset language which is stored in the database out to the specific languages in each of the individual tools used. In its simplest form, the system disclosed is thus a method for data exchange and communication between vendor independent tools and tools that do not necessarily speak the same language or have the same concepts. The present invention thus implements a very neutral format as far as describing the languages concerned such that each of the tools can talk to the one very neutral format. Once in the neutral format, the user may mass communicate to anyone of the other tools.

Figure 2:
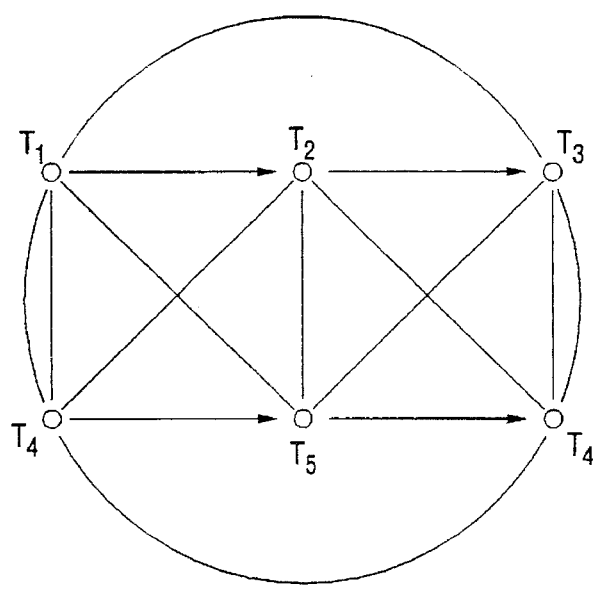
FIG. 2 is a schematic diagram of a prior art vehicle electrical design and analysis system.

A key advantage of the above-described system over the prior art is that prior art systems require two translators to communicate between two applications. See, for example, the schematic of FIG. 2. As readily seen, any time a CAE tool ($T_1$–$T_6$) were to be modified, numerous translators would be required to be modified as well. The present invention, however, only requires one translator between each application and the central database 12.

Figure 3:
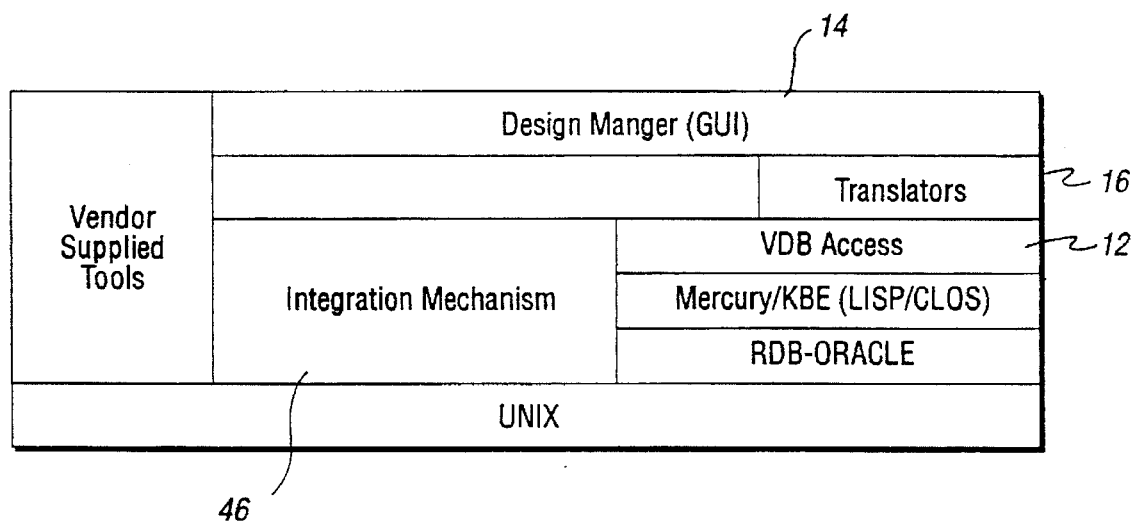
FIG. 3 is a functional block diagram of the architecture of the integrated vehicle electrical design analysis system of the present invention.

With reference to FIG. 3 of the drawings, the architecture of the functional blocks of the system of the present invention may be further described. As shown and indicated above, VDB 12 is the central repository for all design, analysis, and library information. It is implemented preferably in a relational database such as the oracle relational database and contains both common and tool-specific data. Database access is provided through an interface written in LISP and is predominantly object-oriented using a Common Lisp Object System (CLOS). Translators 16 and design manager 14 are then built upon this structure.

There are essentially two kinds of translators in accordance with the present invention with respect to the VDB— inbound and outbound. The outbound translators 44 are responsible for extracting the selected design data from the VDB 12 and translating it into a standard format (EDIF) or a tool specific format if a standard interchange is not available. This interchange format (standard or tool specific) is then translated into the selected tool's internal data structures by a vendor-supplied translator (the tool's inbound translator). The VDB inbound translators 42 are responsible for loading data from the agreed upon interchange format into the VDB 12. In this case, data is converted from the tool's data structures into the interchange format by another translator supplied by the vendor (the tool's outbound translator).

Design manager 14 which is typically a Graphical User Interface (GUI) is operative to assist the user in accessing data in the VDB 12, launching various design or analysis tools and performing administration-type tasks. Additionally, the library information applicable across the tools is maintained through the design manager 14. This provides all users with a consistent definition and interface for this data.

In keeping with the invention, it is necessary that the CAE tools appear to the user as a seamless part of the entire system. These tools are therefore included through an integration mechanism 46 which typically consists of UNIX scripts invoking the tool and controlling data flow to and from the tool. Applicants note that some amount of tweaking within the tool's interface (usually through the tool's customization utility) may be needed to allow the tool to notify the design manager 14 that data is available. In operation, the design manager 14 then triggers an inbound translation. Thus, with one section from the tool's interface, a series of data translations and tool-to-tool communications may take place transparently loading the data into the VDB 12.

Figure 4:
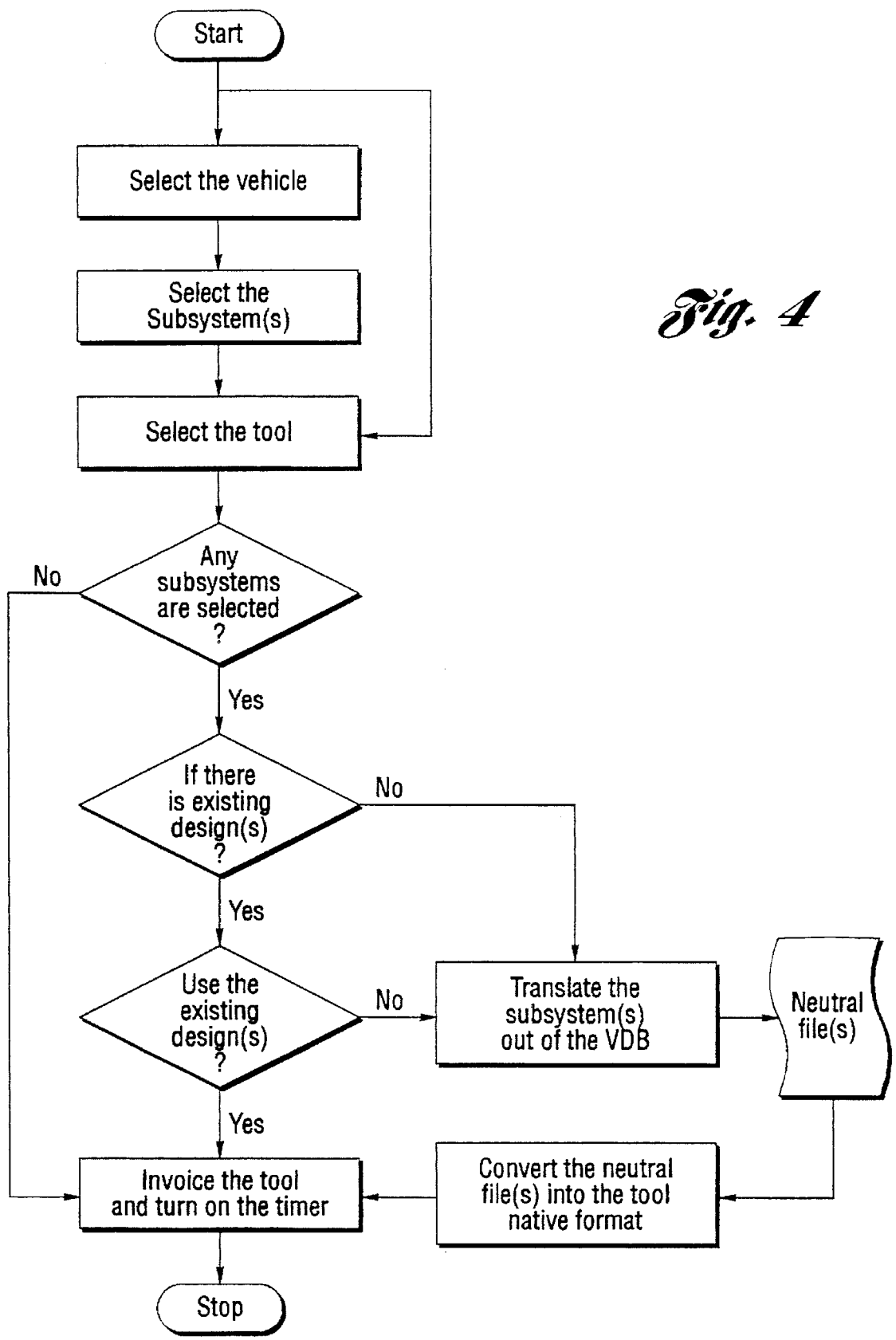
FIG. 4 is a flow diagram of an outbound tool integration in accordance with the present invention.
Figure 5:
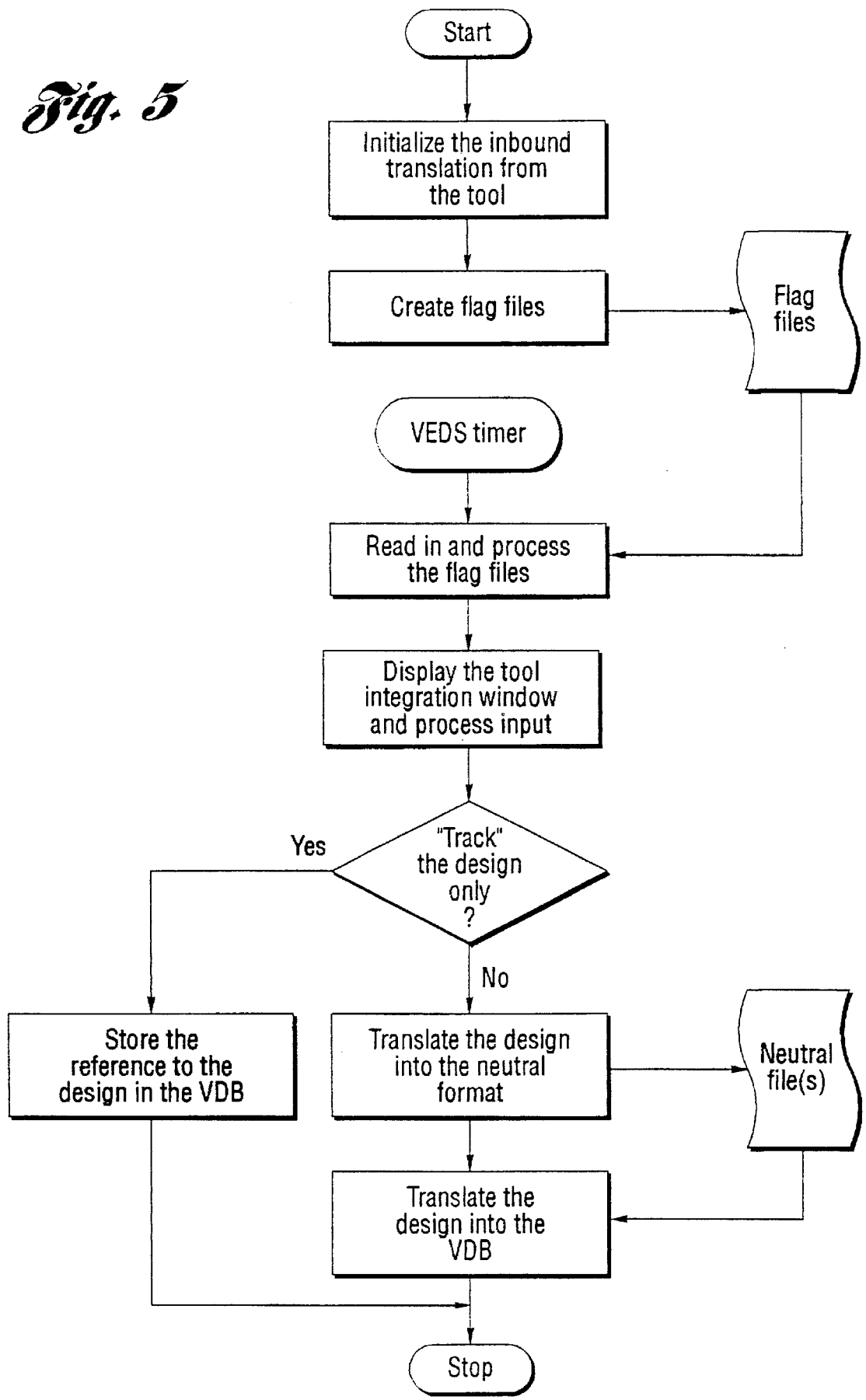
FIG. 5 is a flow diagram of an inbound tool integration in accordance with the present invention.
Figure 6:
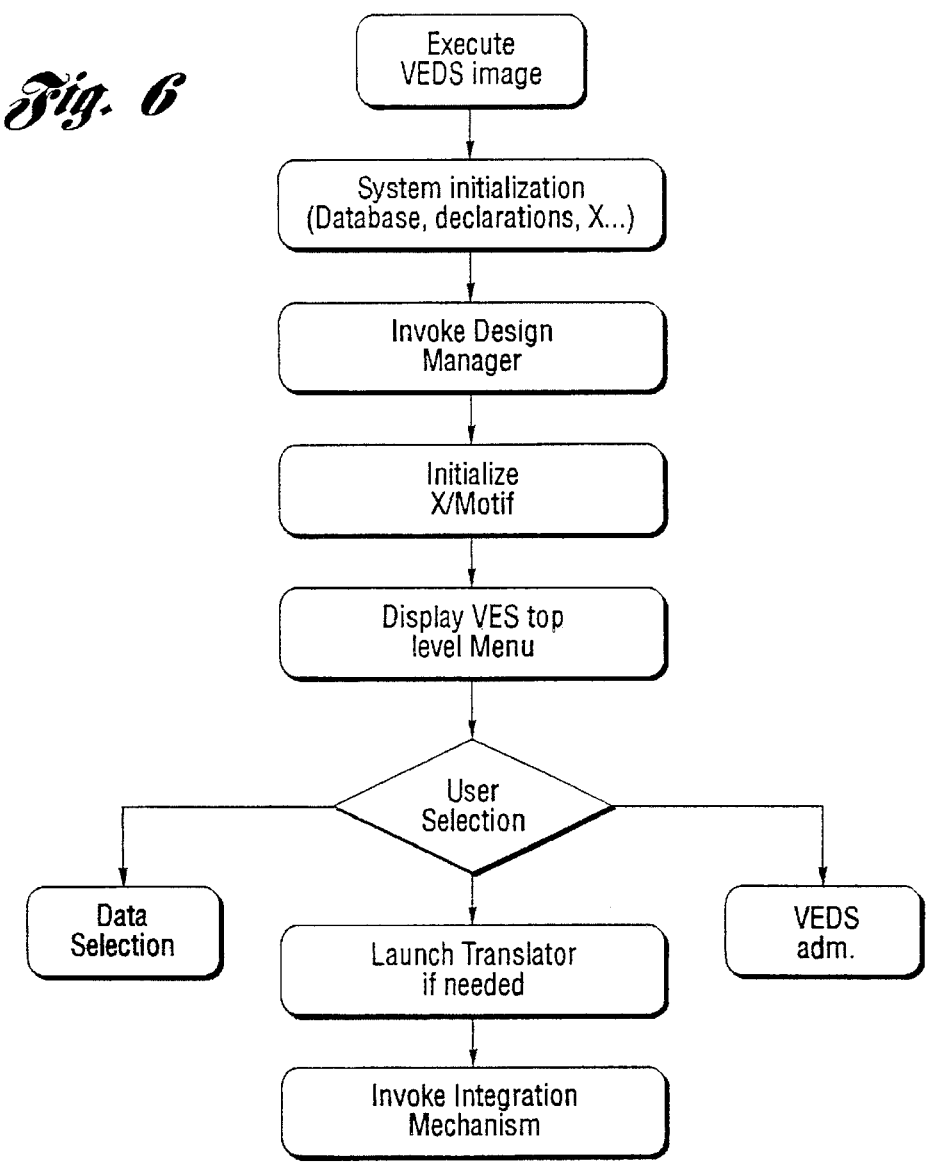
FIG. 6 is a flow diagram of the design manager of the present invention.

The operation of the vendor-neutral integrated vehicle electrical design and analysis system of the present invention may be more readily understood with reference to FIGS. 4–6 of the drawings. As shown in FIG. 4, there is provided a flow chart for the outbound tool integration. As shown, in the outbound direction (from VDB 12 to the CAE tools) the user selects the vehicle INSTANTs and subsystems. Thereafter, the user selects the tool and decides if the existing design(s) is to be used. If there is no existing design(s) for the selected subsystem(s) or the user opts for creating a fresh one(s), the VDB translator will translate the subsystem(s) out of the VDB 12 and create a new file(s) in the neutral format (EDIF). The user might similarly invoke the tool without selecting any subsystems.

In contrast, if the existing design(s) is to be used, the VDB 12 will copy the existing design(s), which is in the tool native format, to a user-working directory. Otherwise, the neutral format (EDIF) files will be translated, by the tool conversion utility, into the tool native format, and put into the user working directory. Thereafter, a script will be called to invoke the tool and automatically bring the design into the tool. In the meantime, a timer is turned on to regularly check the existence of the flagged files.

FIG. 5 of the drawings provides a flow diagram for the inbound tool integration (from the tool to the VDB 12). In operation, the user similarly initializes the inbound translation via VDB integration menu buttons of the tool (not shown) which are implemented using the tool customizing functionality if available. If the tool is not customizable, joint efforts with the vendors might be pursued. The action functions associated with the VDB integration menu buttons will create one or many flagged files containing the instructions about what should be done. With the timer running, the VDB 12 will pick-up and process the flagged files.

As shown, the tool integration window will be displayed and ask the user to provide information such as the vehicle INSTANTs, subsystem name, and if this is "track" only. If the user chooses "track" only, the VDB translator will not be triggered. Only the reference to the design files will be stored in the VDB 12. This feature is designed to avoid littering the VDB and improve the performance. If the user chooses "load", the design will be converted into the neutral format (EDIF) and the VDB translator will be invoked to translate the design (in the neutral format) into the VDB 12.

Turning now to FIG. 6 of the drawings, there is provided a flow diagram of the Design Manager 14. In keeping with the invention, the Design Manager consists of all the X/Motif, C, LISP code that implements the Graphical User Interface (GUI) 14 through which the user interacts with the VDB 12. Examples of such interactions are data selection, tool selection, translator invocation, and VDB administration, etc.

The Design Manager 14 serves to integrate the VDB 12, the translators and the tools in a seamless manner. Thus, the user does not need to know where the data resides, where the tools are, or even how to invoke the tools. All this is encapsulated and made transparent to the user. Still further, it enables the user, typically a designer, to concentrate on the task of design and analysis rather than trying to navigate through a collection of tools and data.

Significantly, the Design Manager is part of VDB executable code. This VDB executable code is created by loading all the LISP code, the C code, the database initialization modules, the data access and manipulation, and the translators in creating what is known as a LISP image. Queries and data items are passed between the C and LISP data structures through the foreign function interface that allows LISP to communicate with other computer languages as known to those skilled in the art.

When the VDB 12 is executed, the database is initialized and a foreign function call is made to invoke the Design Manager 14. This consists of initializing the X window system and motif and then loading the main menu of the VDB. From this point on, the user controls the interaction with the VDB through this menu. The menu is divided into data selection, design tool selection, analysis tool selection, VDB administration, and help sub-menus. In operation, a user typically will select or define data that invoke either a design or an analysis tool to work with. As an option, the user might then go directly to the selected tool.

Being hierarchical in nature, the data is presented in accordance with the present invention for the user in a series of windows. Selection in one window results in different data being available in another window. This data is brought in from the VDB. A query is passed from the C code to the LISP code through the foreign function interface, a LISP function retrieves the data from the database into LISP data structures which is then passed to C data structures and displayed in the appropriate window.

When a tool is selected, if necessary, a translator is invoked in a similar way through the C-LISP interface. After the translation is completed, the Integration Mechanism 46 is invoked to launch the selected tool with the selected data.

With reference to FIGS. 7–13, the operation of translators 16 may be described in further detail. As noted above, the translators 16 are the pieces of software which take information in the VDB 12 and massage that data into the format which the CAE tools can subsequently read and translate into their own internal format. As described herein, a singular translator is the software which converts, in one direction, a specific syntax (e.g. from the VDB 12 to EDIF, from VESCAD native format to the VDB 12). That is not to say that modules of software are not shared between translators, in fact, large sections are reused, but a translator is a functional partitioning of the system which accomplishes that specific goal.

Currently, there are five translators: VDB logical connectivity to EDIF, EDIF to VDB logical connectivity, VDB to VESCAD, VESCAD to VDB, and VDB physical connectivity to EDIF. The EDIF-based translators service many of the industry standard tools and are configurable to accommodate the variations among the tools.

Figure 7:
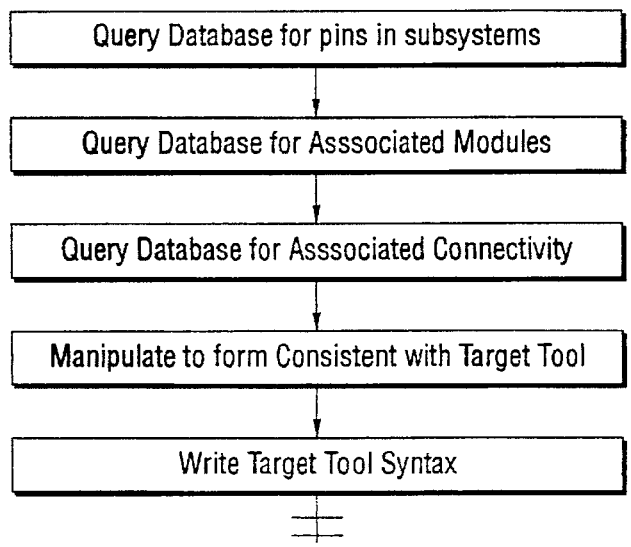
FIG. 7 is a flow diagram illustrating the general strategy for outbound translation in accordance with the present invention.
Figure 8:
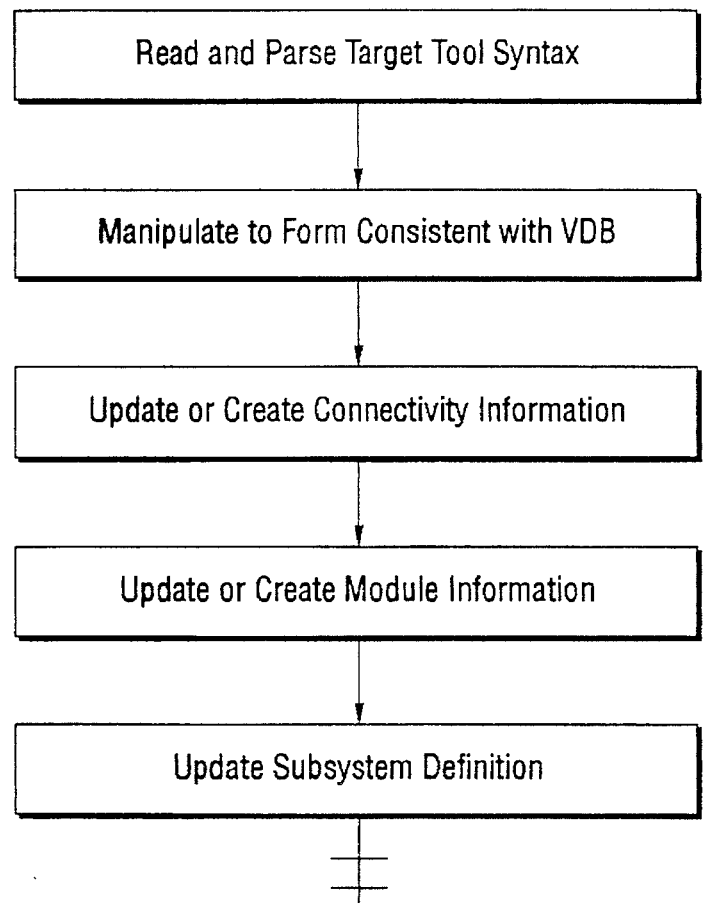
FIG. 8 is a flow diagram illustrating the general strategy for inbound translation in accordance with the present invention.
Figure 9:
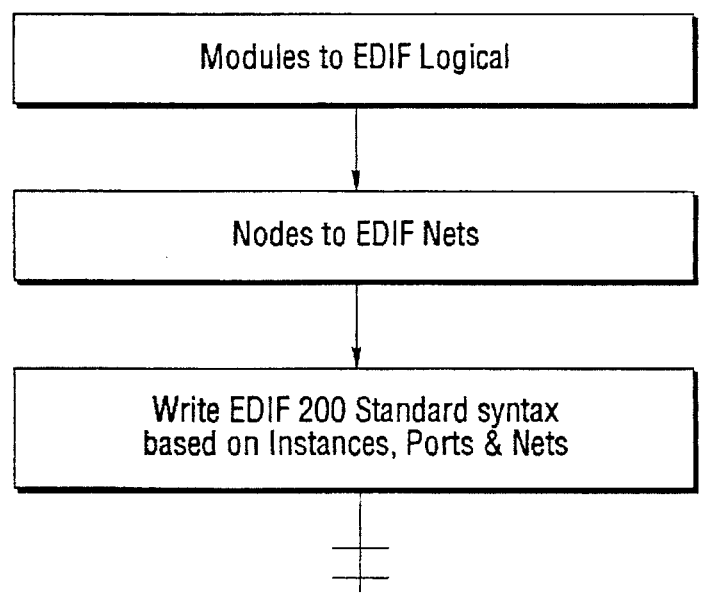
FIGS. 9–12 are flow diagrams illustrating the required manipulations to logical form of the target tool where connectivity information is nodes and target tool is EDIF-based.

Translators which take information from the VDB 12 to a target tool are termed "outbound" translators 44, and translators which move data in the other direction are termed "inbound" 42. While each translator is independent, the outbound translators 44 share, in general, a common strategy, as do the inbound translators 42. These strategies are depicted in FIGS. 7 and 8, respectively.

In keeping with the invention, an outbound translator 44 receives a subsystem reference and uses it to query the database and retrieve all the module pins associated with that subsystem. Any module information required is also retrieved. Connectivity information associated with the pins of the subsystem is also retrieved. (The type of connectivity data elements varies depending on the target CAE tool and the dataset selected by the user.) Thus, pertinent information is retrieved from the VDB 12. The order of this retrieval is not critical and as new subsystem reference mechanisms are added, the retrieval order may change.

Significantly, this pool of information is manipulated as needed to fit to the domain of the target tool. This step is obviously dependent on the domain of the target tool, but always includes mapping of attribute names and values to expected values in the target tool. Depending on the similarity between the VDB data model and the representation used by the target tool, the steps may be more or less complex.

Once the data is manipulated to be consistent with the target tool domain, the syntax of the intermediate format is written out. This can be of any structure and in the current system is either an ASCII file or a relational database. At this point, the translation is complete and control returns to the invoking portion of the system.

As shown in FIG. 8, the inbound translators follow a related strategy, essentially reversing the steps of the outbound translators. For example, given a neutral file reference and a subsystem reference, the first task is to read and/or parse the neutral file format. Picking the pertinent pieces of information from the file, the translator manipulates that information back to the VDB format. Of course, attributes and their values are mapped back to their VDB names and values. Also, during this process, any references to existing data in the database is gleaned. The reference may be by name or number and is typically added during the outbound translation. If no reference is found, it is assumed that data element is new, and it is created in the database.

With those references and the other data parsed out of the neutral file, the connectivity (logical or harness), module and library information is updated or created as needed. The subsystem definition is also updated, relating all necessary data references to the given subsystem reference.

Depending on the amount of data handled during a translation, the read/manipulate/write sequence may not be done in that order for the entire dataset, but rather, that process is iterated for each data type. This eliminates the need to hold in memory a representation of the entire dataset.

The most complicated aspect of the translators are manipulations, i.e. the mapping from the VDB domain to the target tool's domain, or vice versa. To further clarify this task, FIGS. 9–13 depict this manipulation process for a number of the translators. For example, FIG. 9 (and supported by FIG. 11) shows the simplest transformation of the five, the VDB using logical connectivity (or nodes), to EDIF. In this transformation, the VDB data objects map straightforwardly to EDIF domain elements. The modules map to EDIF INSTANTs, the pins map to PORTs, the module library information maps to CELLs and the logical connectivity between pins, VDB nodes, map to EDIF NETs. The only manipulation required is to include any required attributes from the VDB data element as EDIF PROPERTYs.

Figure 10:
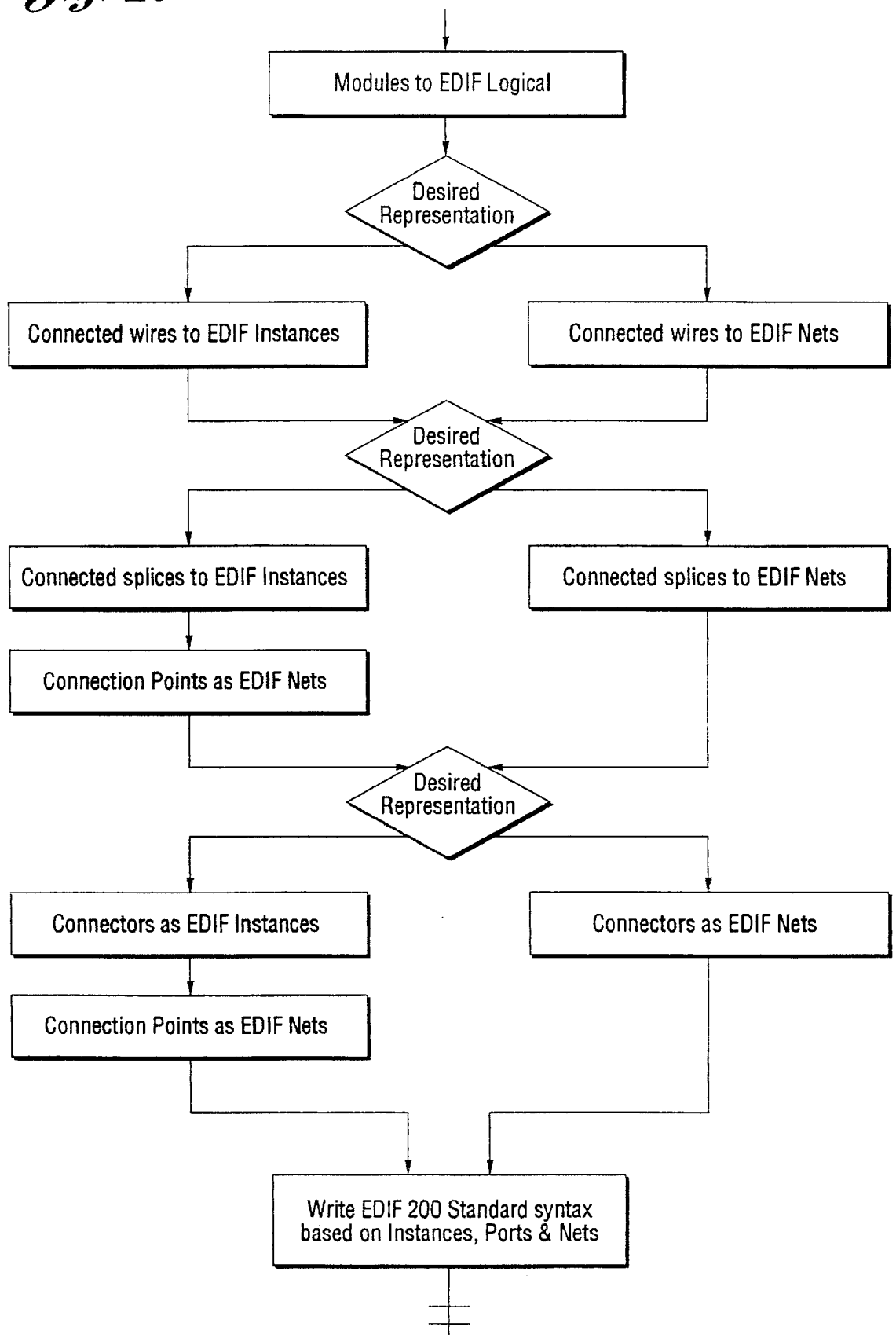
Figure 11:
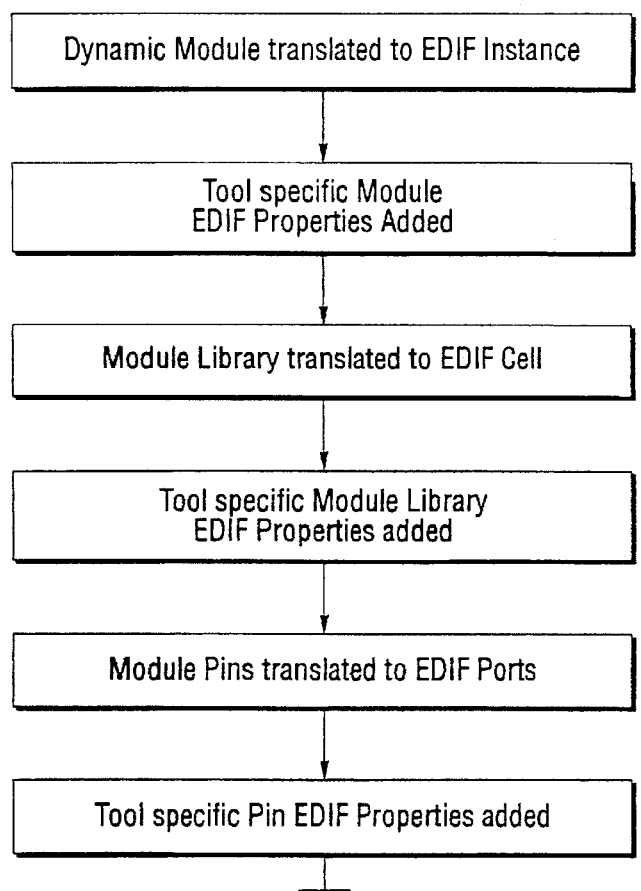
Figure 12:
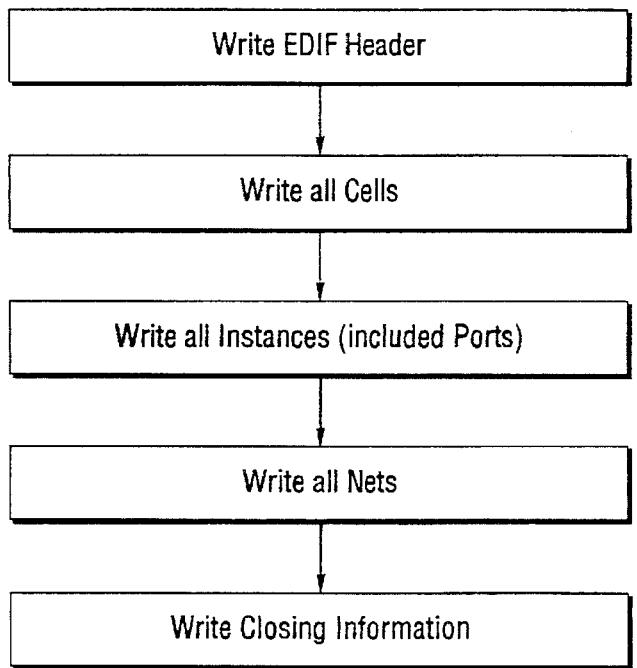

FIG. 10 depicts a complex manipulation, converting wire harness connectivity information into EDIF format. The process of mapping the modules and pins is identical to the previous case. But the type of connectivity needed is different in this translator. Harnesses (having wires, connectors, and splices) are not naturally represented in EDIF. Therefore, a decision must be made as to which EDIF data elements the harness elements should be mapped. There are two options for each of the harness data elements, either they should become EDIF INSTANTs or EDIF NETs. There are arguments to be made for mapping so the translator makes the mapping a selectable option, depicted in the decision boxes labeled "desired representation". The desired representation could be made any time before the translator is invoked, although that option has not been included in the interface and configurable for each invocation of the system as a whole.

Regardless of which desired representation is selected for the harness mapping, and even disregarding whether logical or harness connectivity is the source data, the output of the manipulation phases of the two EDIF outbound translators is the same. That is, an intermediate object representation consisting solely of EDIF elements results. This is used to derive the creation of an ASCII EDIF 200 file as shown, for example, in FIG. 11.

The VESCAD outbound translator handles much larger datasets than either EDIF translator, but the complexity of the manipulation portion lies somewhere between that of the logical connectivity EDIF and the harness connectivity EDIF. Because the entire harness can be uniquely described in the VESCAD intermediate format, no elaborate mapping is required. The definition of library information is slightly different than that of the VDB 12 so there is manipulation done to accommodate this definition as depicted in FIG. 13. The bulk of the work in that translator is simply mapping the names of attributes in the VDB 12 to the proper names in VESCAD and writing that information out to the neutral file format, or in this case, a relational database.

As an example of the use of the system 10 of the present invention, consider the development of a speed sensor. In developing such a system, the use of schematic capture and circuit simulation enabled the integration of a speed signal into an anti-lock braking system (ABS) model, thus eliminating approximately 8 prototype builds. Several circuit designs were further developed in the schematic capture tools supplied by a specified vendor 1. The loading effects on a shared signal for the different circuit designs were then analyzed (transient and frequency analysis) in the circuit simulation tools supplied by a specified vendor 3. Based on these analyses, an optimized circuit design was then chosen without resorting to "hardware on the bench" as the term is used by those skilled in the art.

Such exchange of data between tools is greatly facilitated by the central database 12 of the present invention. Database 12 is specifically designed to have a neutral representation and is especially suitable for proprietary tools which do not have standard interfaces to their data model and for data that is updated by tools used later in the design process.

For example, though it is not required, the above system may also be sent to a harness design tool where it is laid out in the 2-D platform of a vehicle. Saving this "placed" design back to the database augments its logical connectivity with physical information such as wire lengths, splices, etc. This wiring information, combined with the models developed to support the E/E system analysis, may now be used to perform packaged E/E system analysis in the circuit simulation tool—Voltage drop, EMC conducted transients, fuse/wiring sizing, etc. Thus, by varying the placement of the system in a vehicle platform (using the harness design tool), storing in the VDB 12 and then reanalyzing it in the circuit simulation tool, alternative packaging studies may be performed to optimize wire cost and wire/fuse sizing and to eliminate unwanted interactions between circuits.

Optionally, such physical information may also be sent to the schematic capture tool where, in addition to the logical information, the schematic of the system would also reflect wires and splices. In this manner, by not requiring re-entry, many more design alternatives may be explored and analyzed up front, thus reducing the number of prototypes built.

In keeping with the present invention, there is further provided a method for accommodating data interchange between multiple vendor-independent Computer Aided Engineering (CAE) tools. The method is specifically directed for use in an integrated vehicle electrical design and analysis system. With reference to FIG. 14 of the drawings, the method includes the provision 48 of a Vehicle Database (VDB) which is operative as a central repository to store all design, analysis, and library information. The method further includes the provision 50 of an interface for accessing the VDB and exchanging data with the CAE tools. By translating 52, the tool's internal data structures into a standard interchange format, data structures may be loaded 54 from each of the CAE tools into the VDB. Once this information is stored, selected design data from the VDB may be extracted and translated 56 into the standard interchange format or a tool-specific interchange format. This standard or tool-specific interchange format may thereafter be translated 58 into the tool's internal data structures for use.

To assist the user in accessing the VDB launching selected CAE tools and initiating VDB translations, a design manager is also provided 60. Still further, an integration mechanism is provided 62 which is operative to invoke and control data flow to and from selected CAE tools.

While the best modes for carrying out the invention have been described in detail, those familiar with the art to which this invention relates will recognize various alternative designs and embodiments for practicing the invention as defined by the following claims.

What is claimed is:

1. A vendor-neutral integrated vehicle electrical design and analysis system adapted to accommodate data interchange between multiple vendor-independent Computer Aided Engineering (CAE) tools which have different internal data structures to provide a user using one of the CAE tools with a current version of selected design data translated into the internal data structure of the one of the CAE tools, comprising:

a Vehicle Database (VDB) operative as a central repository to store all design, analysis, and library information;

an interface for accessing the VDB and exchanging data with all of the CAE tools;

for each tool, an outbound translator operative to translate the tools internal data structures into a standard interchange format;

an inbound VDB translator operative to load data structures from each of the CAE tools into the VDB;

an outbound VDB translator operative to extract selected design data from the VDB and translate it into the standard interchange format or a tool specific interchange format;

for each tool, an inbound translator operative to translate the standard or tool specific interchange format into the tool's internal data structures;

a design manager for assisting a user in accessing the VDB, launching selected CAE tools and initiating VDB translations to enable the user to perform vehicle design and analysis with the CAE tools; and an integration mechanism operative to invoke and control data flow to and from selected CAE tools so that all of the CAE tools appear to the user as a seamless part of an entire system.

2. The system of claim 1, wherein the interface is written in LISP and is predominantly object-oriented using Common Lisp Object System (CLOS).

3. The system of claim 1, wherein the integration mechanism comprises UNIX scripts.

4. For use in a vendor-neutral integrated vehicle electrical design and analysis system, a method for accommodating data interchange between multiple vendor-independent Computer Aided Engineering (CAE) tools which have different internal data structures to provide a user using one of the CAE tools with a current version of selected design data translated into the internal data structure of the one of the CAE tools, comprising:

providing a vehicle database (VDB) which is operative as a central repository to store all design, analysis and library information;

providing an interface for accessing the VDB and exchanging data with all of the CAE tools;

for each tool, translating the tool's internal data structures into a standard interchange format;

for each tool, loading the translated data structure into the VDB;

extracting selected design data from the VDB and translating the data into the standard interchange format or a tool specific interchange format;

translating the standard or tool interchange format of the selected data into the internal data structure of a selected tool;

providing a design manager to assist a user in accessing the VDB, launching selected CAE tools and initiating VDB translation to enable the user to perform design and analysis with the CAE tools; and providing an integration mechanism operative to invoke and control data flow to and from selected CAE tools so that all of the CAE tools appear to the user as a seamless part of an entire system.

* * * * *